United States Patent
Wu et al.

(10) Patent No.: US 6,890,819 B2
(45) Date of Patent: May 10, 2005

(54) METHODS FOR FORMING PN JUNCTION, ONE-TIME PROGRAMMABLE READ-ONLY MEMORY AND FABRICATING PROCESSES THEREOF

(75) Inventors: Chao-I Wu, Hsinchu (TW); Ming-Hsiu Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/605,253

(22) Filed: Sep. 18, 2003

(65) Prior Publication Data

US 2005/0062079 A1 Mar. 24, 2005

(51) Int. Cl.⁷ .............................................. H01L 21/336
(52) U.S. Cl. ...................... 438/257; 438/239; 438/270; 257/314
(58) Field of Search .......................... 438/239; 257/314

(56) References Cited

U.S. PATENT DOCUMENTS 5,170,227 A * 12/1992 Kaneko et al. ............... 257/67
6,689,644 B2 * 2/2004 Johnson ...................... 438/131
6,780,711 B2 * 8/2004 Johnson et al. ............. 438/257

* cited by examiner

*Primary Examiner*—David Nelms
*Assistant Examiner*—Thao P. Le
(74) *Attorney, Agent, or Firm*—Chyun IP office

(57) ABSTRACT

A method for forming a PN junction is described. A stacked structure consisting of an N-doped (or P-doped) layer, a dielectric layer and a nucleation layer is formed, and then an insulating layer is formed having an opening therein. A P-doped (or N-doped) polysilicon or amorphous silicon layer is filled into the opening, and then annealed to convert into a single-crystal silicon layer. Then, the dielectric layer is broken down to form a PN junction.

19 Claims, 7 Drawing Sheets

METHODS FOR FORMING PN JUNCTION, ONE-TIME PROGRAMMABLE READ-ONLY MEMORY AND FABRICATING PROCESSES THEREOF

BACKGROUND OF INVENTION

1. Field of the Invention

The present invention relates to a semiconductor process and a semiconductor device structure. More particularly, the present invention relates to methods for forming a PN junction, fabricating processes of one-time programmable read-only memory (OTP-ROM) based on the same methods, and structures of OTP-ROM cell and OTP-ROM device fabricated using the same processes.

2. Description of the Related Art

PN junction is a fundamental structure of various semiconductor devices, and is conventionally constituted of polysilicon. However, since polysilicon has many grains of different sizes as well as grain boundaries, the characteristic of polysilicon PN junction is not uniform. In addition, the grain-boundaries of polysilicon induce more leakage paths than single-crystal silicon.

For high-density memory applications, such as the 3D memory, chalcogenide memory, OTP diode or MRAM, steering elements are required to ensure that the current flow is unidirectional. Moreover, uniform characteristics of the memory cells are necessary to increase the sense margin of On-state and Off-state, and decreased leakage current paths are also required to reduce power consumption and heat generation. Therefore, polysilicon PN junctions are not so suitable in high-density memory applications.

For example, U.S. Pat. No. 6,420,215 discloses a structure of a three-dimensional (3D) OTP-ROM, which is formed by alternately stacking layers of parallel N-type polysilicon lines and layers of parallel P-type polysilicon lines. In any two adjacent layers, the orientation of the parallel N-type polysilicon lines is different from that of the parallel P-type polysilicon lines, and a pair of N-type polysilicon line and P-type polysilicon line is separated by an antifuse layer. The overlapping portions of a pair of N-type polysilicon line and P-type polysilicon line and the antifuse layer between them together constitute a memory cell. During the programming operation of the 3D OTP-ROM, a forward bias is applied between a pair of selected N-type polysilicon line and P-type polysilicon line to break down the antifuse layer between them and thereby form a PN junction. However, since the polysilicon PN junctions lack uniform characteristic and have grain boundaries, as mentioned above, the characteristics of the memory cells are not uniform, and a leakage current is easily induced under reverse bias.

A possible method for solving the aforementioned problems of polysilicon PN junction is to control the sizes of polysilicon grains and the locations of grain boundaries. For example, Yonehara et al. disclosed a method for controlling grain boundaries in Materials Research Society, Symp. Proc. Vol. 106, p. 21–26 (1988), which utilizes a selective nucleation process over an amorphous substrate. Specifically, a high-nucleation-density layer (e.g., a $Si_3N_4$ layer) formed on a low-nucleation-density layer (e.g., a $SiO_2$ layer) is patterned into small blocks to serve as nucleation sites. Alternatively, a low-nucleation-density layer formed on a high-nucleation-density layer is patterned to expose small regions of the high-nucleation-density layer to serve as nucleation sites. A gas-phase epitaxial process is then performed to form silicon grains having the same distribution of the nucleation sites. However, since an additional mask is required to pattern the high-nucleation-density layer or the low-nucleation-density layer in the method, the fabricating process is more tedious.

Another possible method for solving the aforementioned problems of conventional PN junction is to use single-crystal silicon material for forming the PN junction. For example, Subramanian et al. disclosed a method for forming a source/drain and a channel in single-crystal silicon in IEEE EDL, Vol. 20, No. 7, p. 341–343 (1999). In the method, a sacrificial oxide layer is formed on an amorphous silicon layer, a small aperture is formed in the sacrificial oxide layer, and then a germanium (Ge) seed layer is selectively formed on the amorphous silicon layer exposed by the small aperture. An annealing process is performed to recrystallize the amorphous silicon layer starting from the portion adjacent to the Ge seed layer, so that the amorphous silicon layer is gradually converted into a single-crystal silicon layer. The Ge seed layer and the sacrificial oxide layer are then removed, and a source/drain region and a channel region are defined in the single-crystal silicon layer. However, since an additional mask is also required to pattern the sacrificial oxide layer, the fabricating process is more tedious.

SUMMARY OF INVENTION

In view of the foregoing, this invention provides methods for forming a PN junction, which include a nucleation process for forming a PN junction that has at least one half, i.e., the P-doped half or the N-doped half, being constituted of single-crystal silicon to improve the uniformity of PN junction. These methods do not need an additional mask for patterning a high-nucleation-density layer, a low-nucleation-density layer or a sacrificial layer.

This invention also provides fabricating processes of one-time programmable read-only memory (OTP-ROM) based on the methods for forming a PN junction of this invention. The processes are intended to improve the uniformity of characteristics of OTP-ROM cells and to reduce the leakage current under reverse bias.

This invention further provides structures of OTP-ROM cell and OTP-ROM device, which are fabricated using the OTP-ROM processes of this invention.

A method for forming a PN junction of this invention is described below. A stacked structure that includes, from bottom to top, a first doped layer of N-type (or P-type), a dielectric layer and a nucleation layer is formed on a substrate. The material of the first doped layer can be polysilicon or single-crystal silicon, such as the surface single-crystal silicon of a silicon wafer. An insulating layer having an opening therein is formed over the substrate, wherein the opening exposes a portion of the nucleation layer. A second doped layer of P-type (or N-type) that is constituted of polysilicon or amorphous silicon is formed in the opening, and then an annealing process is performed to convert the second doped layer into a single-crystal silicon layer. The dielectric layer is then broken down to form a PN junction.

Another method for forming a PN junction of this invention is described below. A stacked structure including, from bottom to top, a first doped layer of N-type (or P-type), a dielectric layer and a second doped layer of P-type (or N-type) is formed on a substrate, wherein the material of the second doped layer is polysilicon or amorphous silicon. An insulating layer having an opening therein is then formed over the substrate, wherein the opening exposes a portion of the second doped layer. A nucleation layer, such as a Ge seed layer, is formed on the second doped layer exposed by the opening. An annealing process is performed to convert the second doped layer under the nucleation layer into a single-crystal silicon layer. The dielectric layer is then broken down to form a PN junction.

The first OTP-ROM process of this invention includes the following steps. A substrate having an insulating layer and linear stacked structures formed thereon is provided (step (a)). The linear stacked structures are embedded in trenches of the insulating layer, and each linear stacked layer includes, from bottom to top, a first semiconductor layer of N-type (or P-type), an antifuse layer and a nucleation layer. The material of the first semiconductor layer can be polysilicon or single-crystal silicon, such as the surface single-crystal silicon of a silicon wafer. Then, a next insulating layer is formed over the substrate (step (b)). A plurality of trenches are formed in the next insulating layer in an orientation different from that of the trenches in the former insulating layer, so that multi-portions of each nucleation layer are exposed (step (c)). Thereafter, P-type (or N-type) polysilicon is filled into the trenches of the next insulating layer (step (d)). An annealing process is then performed to convert the polysilicon on the nucleation layer into single-crystal silicon (step (e)).

The first OTP-ROM process of this invention may further include the following steps to form a 3D memory having multi-layers of memory cells. A conductive layer is formed on the polysilicon in each trench of the next insulating layer (step (f)). Then, a next semiconductor layer, a next antifuse layer and a next nucleation layer are sequentially formed on the conductive layer in each trench of the next insulating layer, so as to form a next linear stacked structure in each trench (step (g)). The steps (b)–(g) are repeated cyclically to form upper insulating layers and linear stacked structures until a predetermined number of layers of memory cells are fabricated. In this process, the orientation of the trenches formed in one insulating layer is different from that of the trenches formed in an adjacent insulating layer, and the step (g) is not performed in the last cycle of steps. For example, when only two layers of memory cells are to be formed, the steps (b)–(f) are repeated only once. In the OTP-ROM process of this invention, the conductive layers are formed as word lines or bit lines, and the layers of word lines and the layers of bit lines are formed alternately. That is, when the conductive layers in one layer of linear stacked structures serve as word lines (or bit lines), the conductive layers in an adjacent layer of linear stacked structures serve as bit lines (or word lines).

This invention also provides a second OTP-POM process, which includes the following steps. A substrate having an insulating layer and linear stacked structures formed thereon is provided (step (a)). The linear stacked structures are embedded in trenches of the insulating layer, and each linear stacked layer includes, from bottom to top, a first semiconductor layer of N-type (or P-type), an antifuse layer and an amorphous silicon layer of P-type (or N-type). The material of the first semiconductor layer can be polysilicon or single-crystal silicon, such as the surface single-crystal silicon of a silicon wafer. Then, a next insulating layer is formed over the substrate (step (b)). A plurality of trenches are formed in the next insulating layer in an orientation different from that of the trenches in the former insulating layer, so that multi-portions of each amorphous silicon layer are exposed (step (c)). Thereafter, a nucleation layer is formed in each trench in the next insulating layer (step (d)). An annealing process is performed to convert the amorphous silicon under the nucleation layer into single-crystal silicon (step (e)). The nucleation layer is then removed (step (f)), and a conductive layer is formed in each trench in the next insulating layer (step (g)).

As mentioned above, in the OTP-ROM processes of this invention, the step of defining silicon nucleation sites is integrated with the inherent damascene process. That is, single-crystal silicon is formed on a nucleation layer exposed by the damascene openings of an inter-layer insulator, or is formed under a nucleation layer formed in the damascene openings of an inter-layer insulator. Therefore, this invention does not need an additional mask to pattern the high-nucleation-density layer (=the nucleation layer) or the low-nucleation-density layer (=the dielectric layer or the antifuse layer between a P-doped layer and an N-doped layer). Meanwhile, no sacrificial layer needs to be formed and patterned for defining silicon nucleation sites in the processes.

Moreover, the second OTP-POM process of this invention can further include the following steps to form a second layer of memory cells. A next semiconductor layer of N-type (or P-type) and a next antifuse layer are formed on the conductive layer in each trench of the next insulating layer (step (h)). A next amorphous silicon layer of P-type (or N-type) is formed over the substrate (step (i)). A plurality of linear nucleation layers are then formed on the next amorphous silicon layer, wherein each linear nucleation layer is located over a next semiconductor layer (step (j)). An annealing process is performed to convert the amorphous silicon under the linear nucleation layers into single-crystal silicon (step (k)). Thereafter, the linear nucleation layers are removed (step (l)). A next conductive layer is formed on the next amorphous silicon layer containing single-crystal silicon (step (m)). The next conductive layer and the next amorphous silicon layer containing single-crystal silicon are then patterned into a plurality of linear stacked structures that have an orientation different from that of the trenches in the next insulating layer (step (n)). Thus, an OTP-ROM having two layers of memory cells is formed.

Furthermore, the second OTP-POM process of this invention can further include some modifications and steps to form a 3D memory having multi-layers of memory cells. Specifically, the step (m) can further include sequentially forming a still next semiconductor layer of N-type (or P-type), a still next antifuse layer and a still next amorphous silicon layer of P-type (or N-type). Meanwhile, the still next amorphous silicon layer, the still next antifuse layer, the still next semiconductor layer, the next conductive layer and the next amorphous silicon layer containing single-crystal silicon are sequentially patterned to form a plurality of linear stacked structures in step (n). The second OTP-POM process further including a step (O) that fills a still next insulating layer in between the linear stacked structures formed in step (n). The steps (b)–(o) are then repeated cyclically to form upper insulating layers and linear stacked structures until a predetermined number of layers of memory cells are fabricated. In addition, the cycling process is terminated on a step (g) or a step (n). When the cycling process is terminated on a step (n), the step (m) just before the terminal step (n) does not form a still next semiconductor layer, a still next antifuse layer and a still next amorphous silicon layer, and the terminal step (n) does not pattern a still next amorphous silicon layer, a still next antifuse layer and a still next semiconductor layer. In addition, it is also feasible to perform a half cycle of the aforementioned steps, i.e., to repeat steps (b)–(g) only once, to form an OTP-ROM having only three layers of memory cells.

Since at least one of a pair of P-doped layer and N-doped layer that constitute a PN junction is composed of single-crystal silicon in the methods for forming PN junction and the OTP-ROM processes of this invention, the characteristics of PN junction are more uniform, and the leakage current of the PN junction under reverse bias can be reduced. Therefore, the characteristics of the OTP-ROM cells or other devices having such PN junctions are more uniform, and the leakage current of the same can also be reduced.

On the other hand, the OTP-ROM cell of this invention includes a first doped layer of N-type (or P-type), an antifuse layer, a nucleation layer and a second doped layer of P-type (or N-type). The first doped layer is disposed on a substrate, and may be composed of polysilicon or single-crystal silicon, such as the surface single-crystal silicon of a silicon wafer. The antifuse layer is disposed on the first doped layer, and the nucleation layer on the antifuse layer. The second doped layer is disposed on the nucleation layer, and is composed of single-crystal silicon.

Moreover, this invention provides an OTP-ROM structure that is based on the OTP-ROM cell of this invention and is formed with the first OTP-ROM process of this invention. The OTP-ROM includes a plurality of linear stacked structures and a plurality of linear silicon layers crossing over the linear stacked structures. Each linear stacked structure includes, from bottom to top, a semiconductor layer of N-type (or P-type), an antifuse layer and a nucleation layer, wherein the semiconductor layer may be composed of single-crystal silicon, such the surface single-crystal silicon of a silicon wafer. The linear silicon layers are P-doped (or N-doped). Each linear silicon layer is constituted of a plurality of polysilicon blocks and a plurality of single-crystal silicon blocks that are arranged alternately. A single-crystal silicon block is on the nucleation layer of a linear stacked structure that overlaps with the linear silicon layer, and a polysilicon block is located between two single-crystal silicon blocks.

This invention further provides another OTP-ROM structure that is formed with the second OTP-ROM process of this invention. The structure includes a plurality of linear stacked structures and a plurality of linear conductive layers crossing over the linear stacked structures. Each linear stacked structure includes, from bottom to top, a semiconductor layer of N-type (or P-type), an antifuse layer and a silicon layer of P-type (N-type), wherein the semiconductor layer may be composed of polysilicon or single-crystal silicon, such the surface single-crystal silicon of a silicon wafer. Each silicon layer is constituted of a plurality of amorphous silicon blocks and a plurality of single-crystal silicon blocks that are arranged alternately. A single-crystal silicon block is under a linear conductive layer that overlaps with the silicon layer, and an amorphous silicon block is located between two single-crystal silicon blocks.

Since at least one of a pair of P-doped layer and N-doped layer that constitute a PN junction is composed of single-crystal silicon in the OTP-ROM cell or the OTP-ROM structures of this invention, the characteristics of PN junction are more uniform, and the leakage current of the PN junction under reverse bias can be reduced. Therefore, the characteristics of the OTP-ROM cells having such PN junctions are more uniform, and the leakage current of the same can also be reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A–1C illustrate a method for forming a PN junction according to a first embodiment of this invention, wherein FIG. 1C shows the structure of an OTP-ROM cell of the first embodiment.

DETAILED DESCRIPTION

Figure 1A:
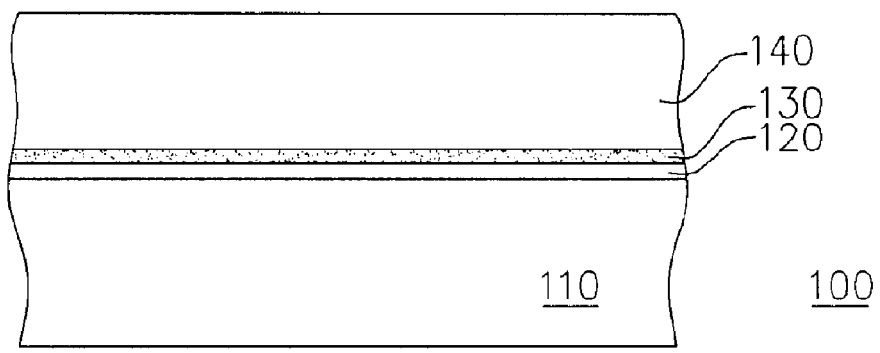
Figure 1B:
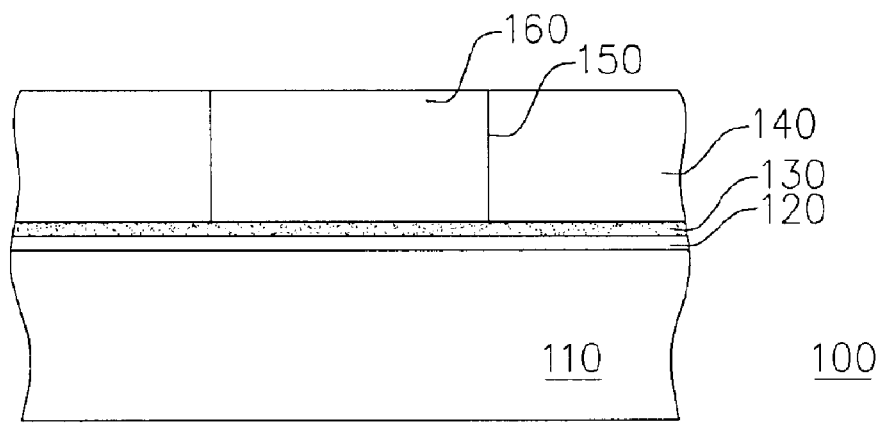
Figure 1C:
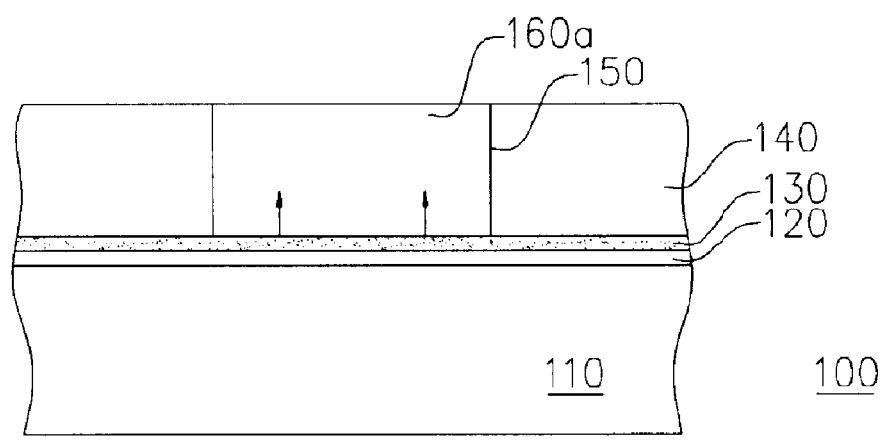

First Embodiment: FIGS. 1A–1C illustrate a method for forming a PN junction according to the first embodiment of this invention, wherein FIG. 1C shows the structure of an OTP-ROM cell of the first embodiment.

Referring to FIG. 1A, a stacked structure of an N-doped layer 110, a dielectric layer 120 and a nucleation layer 130 is formed on a substrate 100. The substrate 100 may be an insulating layer or a semiconductor layer, such as the surface layer of a single-crystal silicon wafer. When the substrate 100 is the surface layer of a single-crystal silicon wafer, the N-doped layer 110 can be formed directly in the substrate 100, and thus the material of the N-doped layer 110 is single-crystal silicon. In addition, the material of the N-doped layer 110 can be, for example, doped polysilicon, which is deposited on the substrate 100 using in-situ doping. The material of the dielectric layer 120 is preferably silicon oxide, which can be formed using a low-pressure chemical vapor deposition (LPCVD) or thermal oxidation method. The nucleation layer 130 is preferably composed of a material having high density of nucleation sites, such as a silicon nitride, which may be formed using a LPCVD method. A nucleation layer 130 of silicon nitride can also be formed via thermal nitridation of the surface of the dielectric layer 120 when the material of the dielectric layer 120 is silicon oxide.

Referring to FIG. 1B, an insulating layer 140 is formed over the substrate 100. The insulating layer 140 is preferably composed of silicon oxide, and can be formed using a deposition process, such as an atmospheric-pressure chemical vapor deposition (APCVD) process. An opening 150 is then formed in the insulating layer 140 by, for example, performing a photolithography process and a subsequent anisotropic plasma etching process. A P-doped silicon layer 160 that is composed of polysilicon or amorphous silicon is filled into the opening 150. The filling process includes, for example, a LPCVD process and a subsequent etching-back (EB) process or chemical mechanical polishing (CMP) process.

Referring to FIG. 1C, an annealing process is performed to recrystallize the P-doped silicon layer 160 starting from the portion adjacent to the nucleation layer 130, as indicated by the direction of the arrows, so as to convert it into a P-doped single-crystal silicon layer 160a. The annealing process is preferably performed under 500–550° C., and is continued for a period that increases with the thickness of the P-doped silicon layer 160. Thereafter, a sufficient forward bias is applied between the N-doped layer 110 and the P-doped single-crystal silicon layer 160a to break down the nucleation layer 130 and the dielectric layer 120 and thereby form a PN junction.

On the other hand, the structure of an OTP-ROM cell of the first embodiment is depicted in FIG. 1C. The memory cell includes an N-doped layer 110 on a substrate 100, an antifuse layer 120 on the N-doped layer 110, a nucleation layer 130 on the antifuse layer 120, and a P-doped single-crystal silicon layer 160a on the nucleation layer 130. In addition, the conductivity types of the two doped layers 110 and 160a can be readily interchanged, which is well known to those skilled in the art and therefore not explained herein.

Figure 2A:
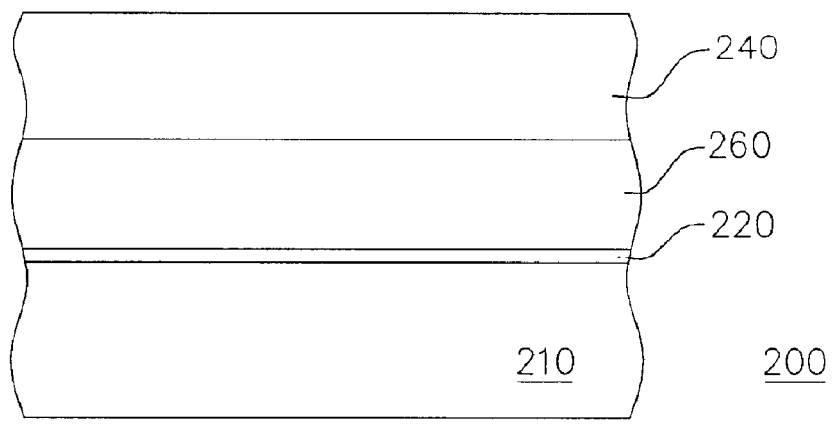
FIGS. 2A–2C illustrate a method for forming a PN junction according to a second embodiment of this invention.
Figure 2B:
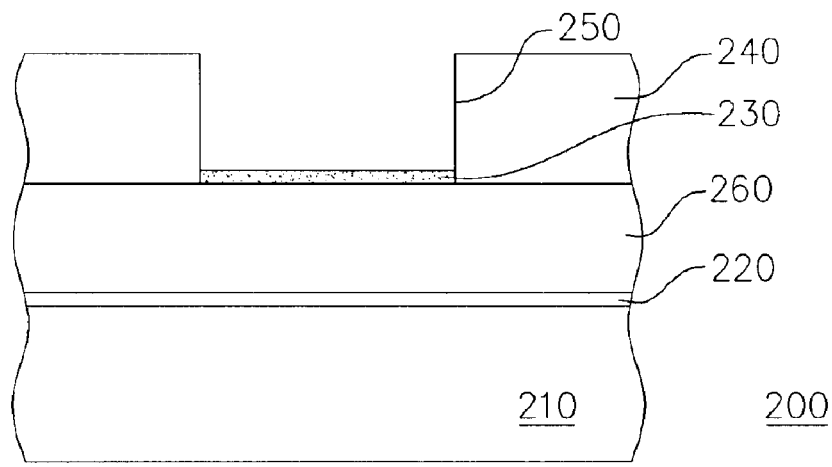
Figure 2C:
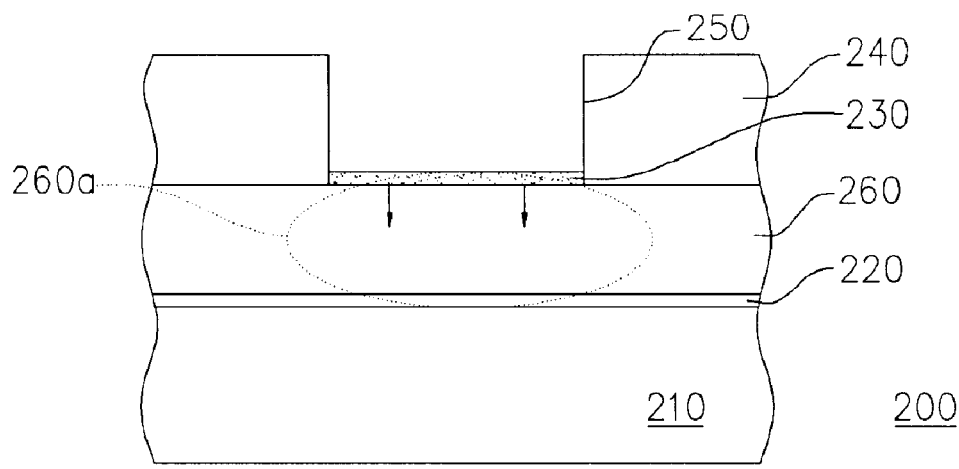

Second Embodiment: FIGS. 2A–2C illustrate a method for forming a PN junction according to the second embodiment of this invention.

Referring FIG. 2A, a stacked structure of an N-doped layer 210, a dielectric layer 220 and a P-doped silicon layer 260 is formed on a substrate 200, and then an insulating layer 240 is formed over the substrate 200. The materials or forming methods of the substrate 200, the n-doped layer 210, the dielectric layer 220, the insulating layer 240 and the P-doped silicon layer 260 are the same as those mentioned in the first embodiment, for example.

Referring to FIG. 2B, an opening 250 is formed in the insulating layer 240, and then a nucleation layer 230 is formed on the P-doped silicon layer 260 exposed by the opening 250. The nucleation layer 230 is, for example, a germanium (Ge) seed layer. The Ge seed layer may be formed by, for example, performing a LPCVD process with GeH$_4$ as a reaction gas to selectively deposit a polycrystalline Ge layer on the P-doped silicon layer 260 under 450° C., and then recrystallizing the poly-Ge layer into a single-crystal germanium layer under 550° C.

Referring to FIG. 1C, an annealing process is performed to recrystallize the P-doped silicon layer 260 under the nucleation layer 230 starting from the portion adjacent to the nucleation layer 230, as indicated by the direction of the arrows, so as to form a P-doped single-crystal silicon layer 260a that is roughly marked by the dotted-line circle. The annealing process is preferably performed under 500–550° C., and is continued for a period that increases with the thickness of the P-doped silicon layer 260. Thereafter, a sufficient forward bias is applied between the N-doped layer 210 and the P-doped single-crystal silicon layer 260a to break down the dielectric layer 220 and thereby form a PN junction.

Analogously, the conductivity types of the two doped layers 210 and 260 in the second embodiment can also be interchanged, as in the case of the first embodiment, which is well known to those skilled in the art and therefore not explained herein. However, it is noted that when the materials of the two doped layers are polysilicon and single-crystal silicon, respectively, and the major carrier concentrations of the two are remarkably different for special considerations, the one composed of single-crystal silicon is preferably the one having the lower major carrier concentration. Thus, the characteristics of the PN junction can be more uniform. The reason is that the depletion region in the one having the lower major carrier concentration has a larger width and therefore requires higher uniformity, while the use of single-crystal silicon having orderly lattices can meet the requirement.

Since at least one of a pair of P-doped layer and N-doped layer that constitute a PN junction is composed of single-crystal silicon in the methods of the first and the second embodiments, the characteristics of PN junction are more uniform, and the leakage current of the PN junction under reverse bias can be reduced. Therefore, the characteristics of the OTP-ROM cells or other devices having such PN junctions are more uniform, and the leakage current of the same can also be reduced.

Third Embodiment: FIGS. 3A–3D illustrate a process flow of fabricating an OTP-ROM device according to the third embodiment of this invention, wherein FIGS. 3B/3C/3D shows an OTP-ROM having 1/2/3 layers of memory cells according to the third embodiment.

Figure 3A:
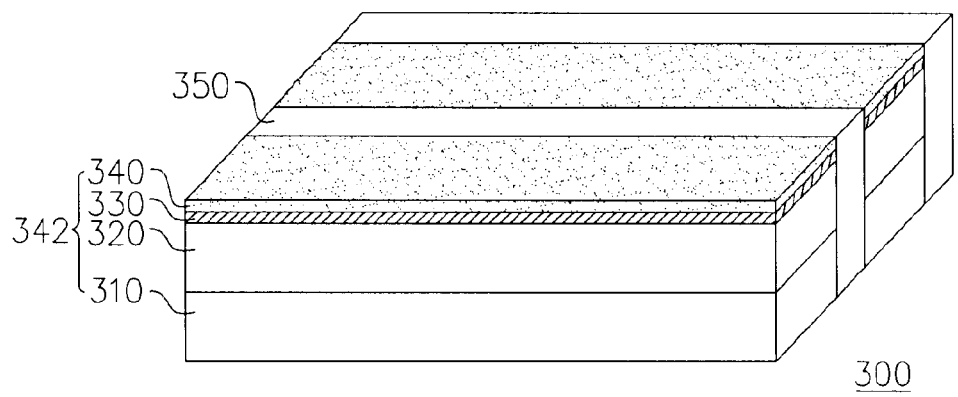
FIGS. 3A–3D illustrate a process flow of fabricating an OTP-ROM device according to a third embodiment of this invention, wherein FIGS. 3B/3C/3D shows an OTP-ROM structure of the third embodiment having 1/2/3 layers of memory cells.

Referring to FIG. 3A, a conductive layer 310, an N-doped layer 320, an antifuse layer 330 and a nucleation layer 340 are sequentially formed on a substrate 300. When the surface layer of the substrate 300 is an insulator, the material of the conductive layer 310 is a metal silicide, for example, which is formed with a deposition process, such as a LPCVD process. When the substrate 300 is the surface layer of a single-crystal silicon wafer, the conductive layer 310 can be an N$^+$-doped layer formed therein. The material of the N-doped layer 320 is polysilicon, for example, which may be formed by performing a LPCVD process with in-situ doping. The N-doped layer 320 can also be a doped layer formed in the surface layer of a single-crystal silicon wafer, while the material of the N-doped layer 320 is single-crystal silicon in this case. The material of the antifuse layer 330 is silicon oxide, for example, which may be formed with LPCVD or thermal oxidation. The material of the nucleation layer 340 is silicon nitride, for example, which can be formed via LPCVD or thermal nitridation. The nucleation layer 340, the antifuse layer 330, the N-doped layer 320 and the conductive layer 310 are sequentially patterned by using the same mask to form parallel linear stacked structures 342, wherein the conductive layers 310 serve as word lines of the memory cells of the first layer. Thereafter, an insulating layer 350, such as a silicon oxide layer, is filled in between the linear stacked structures 342.

Figure 3B:
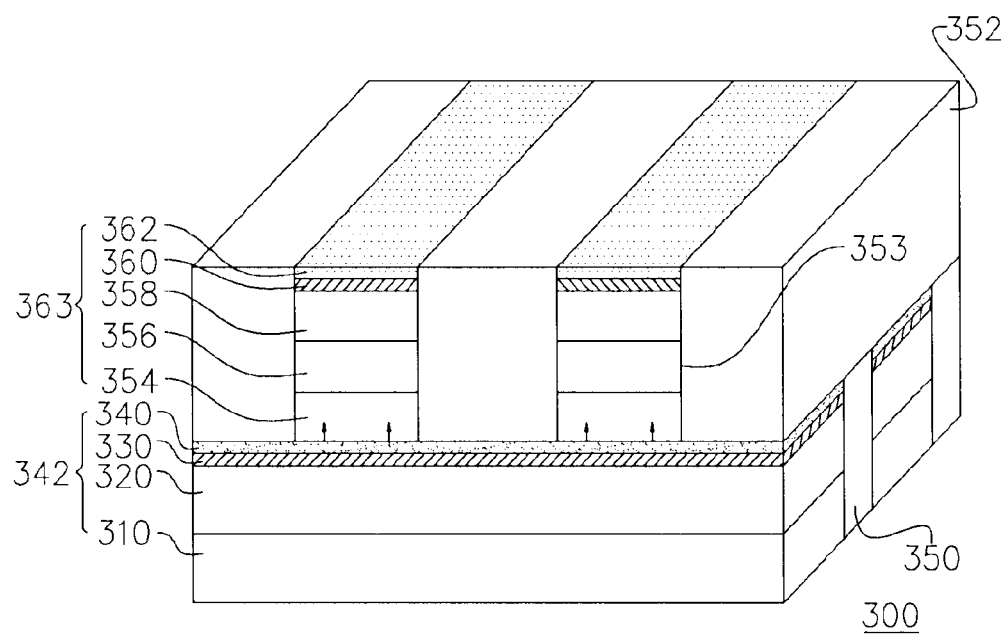

Referring to FIG. 3B, another insulating layer 352 is formed over the substrate 300, and then patterned to formed parallel trenches 353 having an orientation perpendicular to that of the linear stacked structures 342 in the former insulating layer 350. A P-doped layer 354, a conductive layer 356, an N-doped layer 358, an antifuse layer 360 and a nucleation layer 362 are sequentially filled into each trench 353 to form a linear stacked structure 363 therein. The material of the P-doped layers 354 is polysilicon or amorphous silicon, and the conductive layers 356 serve as bit lines of the memory cells of the first and the second layers. The N-doped layers 358, the antifuse layers 360 and the nucleation layers 362 are parts of the memory cells of the second layer, and the materials of the conductive layers 356, the N-doped layers 358, the antifuse layers 360 and the nucleation layers 362 are the same as those mentioned above. It is noted that when only one layer of memory cells is required to form, the above steps are terminated on the filling step of the conductive layer 356. An annealing process is then performed to convert the portions of the P-doped polysilicon or amorphous silicon layers 354 on the nucleation layer 340 into single-crystal silicon layers, whereby the memory cells of the first layer are finished. As shown in the drawing, a P-doped single-crystal silicon layer 354, the nucleation layer 340 and the antifuse layer 330 under the P-doped single-crystal silicon layer 354, and the portion of the N-doped layer 320 under the same together constitute a memory cell of the first layer.

Figure 3C:
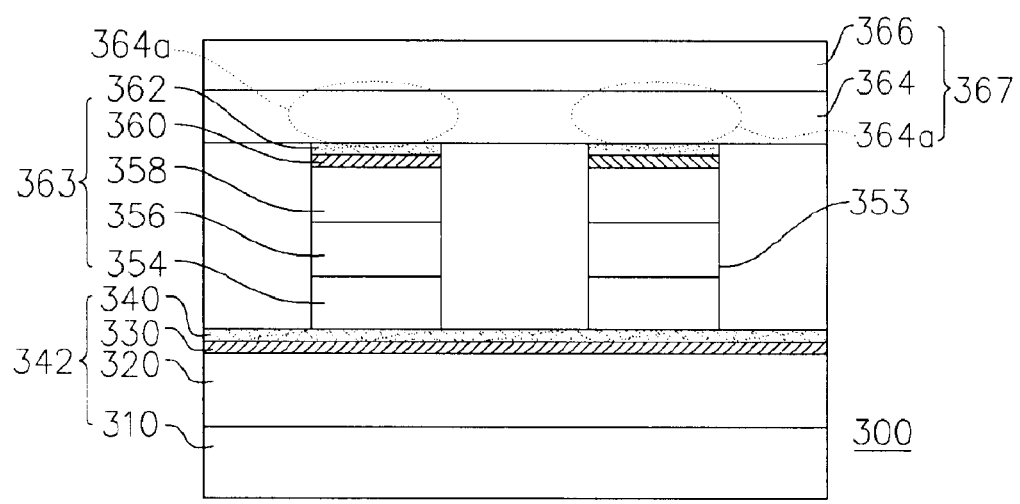

Referring to FIG. 3C, the steps illustrated in FIG. 3B, including forming an upper insulating layer (not shown), defining trenches (not shown) and filling P-doped polysilicon or amorphous silicon layers (364) and conductive layers (366) into the trenches, are repeated again. However, the orientation of the trenches in the upper insulating layer is perpendicular to that of the trenches 353 in the insulating layer 352 and parallel to the surface of paper. Therefore, the upper insulating layer and the trenches therein are not shown in FIG. 3C. An annealing process is performed to convert the portions of the P-doped amorphous silicon or polysilicon layer 364 on the nucleation layers 362 into single-crystal silicon layers 364a, whereby the memory cells of the second layer are finished. As shown in the drawing, a P-doped single-crystal silicon layer 364a, the nucleation layer 362 and the antifuse layer 360 under the P-doped single-crystal silicon layer 364a, and a portion of a N-doped layer 358 under the same together constitute a memory cell of the second layer. In addition, the conductive layers 366 serve as word lines of the memory cells of the second layer.

Figure 3D:
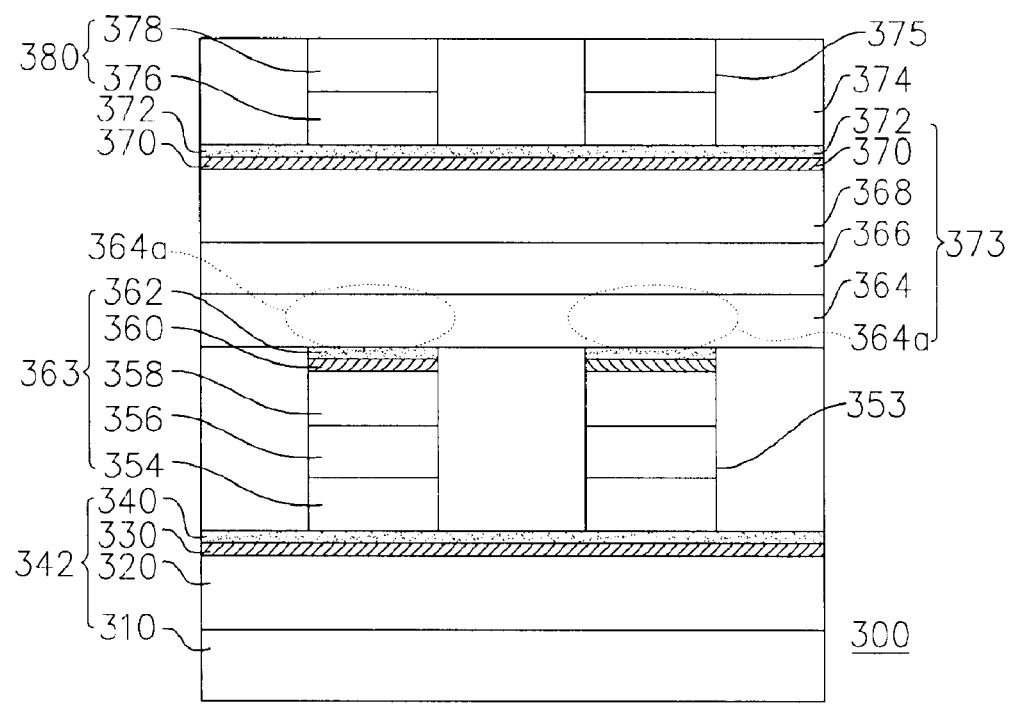

Analogously, higher layers of memory cells can be formed by cyclically repeating the above steps. For example, as shown in FIG. 3D, by forming an N-doped layer 368, an antifuse layer 370 and a nucleation layer 372 on the conductive layer 366 in each trench (not shown) via sequential damascene steps, the structure of the obtained linear stacked structure 373 is the same as that of a linear stacked structure 363 in FIG. 3B, while the orientations of 363 and 373 are perpendicular to each other. Thereafter, an insulating layer 374 is formed, and the above damascene process is repeated again to form trenches 375 and a linear stacked structure 380 of a P-doped silicon layer 376 and a conductive layer 378 in each trench 375. Then, an annealing process is performed to convert the portions of the P-doped silicon layers 376 on the nucleation layer 372 into single-crystal silicon layers, whereby the third layer of memory cells are completed.

Briefly speaking, an OTP-ROM device having multi-layers of memory cells can be obtained by cyclically repeating the steps of forming an insulating layer, defining trenches and forming a linear stacked structure of a P-doped layer, a conductive layer, an N-doped layer, an antifuse layer and a nucleation layer in each trench. The key point is that the orientation of the linear stacked structures/trenches in one insulating layer is perpendicular to that of the linear stacked structures/trenches in an adjacent insulating layer, as indicated by the linear stacked structures 342 and 363 in FIG. 3B. In addition, it is noted that each of the linear stacked structures formed in the last cycle of steps consists of a P-doped silicon layer and a conductive layer, wherein the conductive layer serves as a word line or a bit line of the memory cells of the highest layer. As shown in FIG. 3C or 3D, each linear stacked structure 367 or 380 of the highest layer does not include an N-doped layer, an antifuse layer and a nucleation layer because no memory cell is formed over the highest layer of memory cells, wherein the conductive layers 366 or 378 serve as word lines or bit lines of the memory cells of the highest layer.

On the other hand, the structure of an OTP-ROM having only one layer of memory cells according to the third embodiment is shown in FIG. 3B, and is obtained by performing the first step illustrated in FIG. 3A through the filling step of the conductive layers 356 illustrated in FIG. 3B. The structure of an OTP-ROM having two layers of memory cells is obtained by performing the first step through the filling step of the conductive layer 366 illustrated in FIG. 3C. Generally speaking, as shown in FIGS. 3C–3D, a three-dimensional OTP-ROM of the third embodiment includes at least three layers of linear stacked structures, wherein the orientations of linear stacked structure in two adjacent layers are different, as indicated by the orientations of the linear stacked structures 363 and 373. Each linear stacked structure (e.g., 363) includes, from bottom to top, a P-doped silicon layer (354), a conductive layer (356), an N-doped semiconductor layer (358), an antifuse layer (360) and a nucleation layer (362), Each linear stacked structure 342 of the lowest layer does not include a P-doped silicon layer, i.e., no P-doped silicon layer is disposed under the conductive layer 310 of each linear stacked structure 342. Meanwhile, each linear stacked structure of the highest layer does not include an N-doped semiconductor layer, an antifuse layer and a nucleation layer. As shown in FIG. 3D, no layer is further formed on the conductive layer 378 of each linear stacked structure 380 of the highest layer. In addition, each P-doped layer (e.g., 364) includes single-crystal silicon blocks (364a) and polysilicon blocks each between two single-crystal silicon blocks (364a). A single-crystal silicon block (364a) is located on the nucleation layer (362) of a lower stacked structure (363) that overlaps with the P-doped layer (364).

Moreover, as well known to those skilled in the art, the conductivity types of the P-doped layers and the N-doped layers in the aforementioned third embodiment can be readily interchanged to meet some special requirements.

Since at least one of a pair of P-doped layer and N-doped layer that constitute a PN junction is composed of single-crystal silicon in the OTP-ROM structure of the third embodiment, the characteristics of PN junction are more uniform, and the leakage current of the PN junction under reverse bias can be reduced. Therefore, the characteristics of the OTP-ROM cells having such PN junctions are more uniform, and the leakage current of the same can also be reduced.

Moreover, the step of defining silicon nucleation sites is integrated with the inherent damascene process in the OTP-ROM process of the third embodiment. That is, single-crystal silicon is formed on the nucleation layer exposed by the openings in an inter-layer insulator. Therefore, this invention does not need an additional mask to pattern the high-nucleation-density layer (or the nucleation layer) or the low-nucleation-density layer (or the antifuse layer).

Fourth Embodiment: FIGS. 4A–4F illustrate a process flow of fabricating an OTP-ROM device according to the fourth embodiment of this invention, wherein FIGS. 4C/4E/4F shows an OTP-ROM having 1/2/3 layers of memory cells according to the fourth embodiment.

Figure 4A:
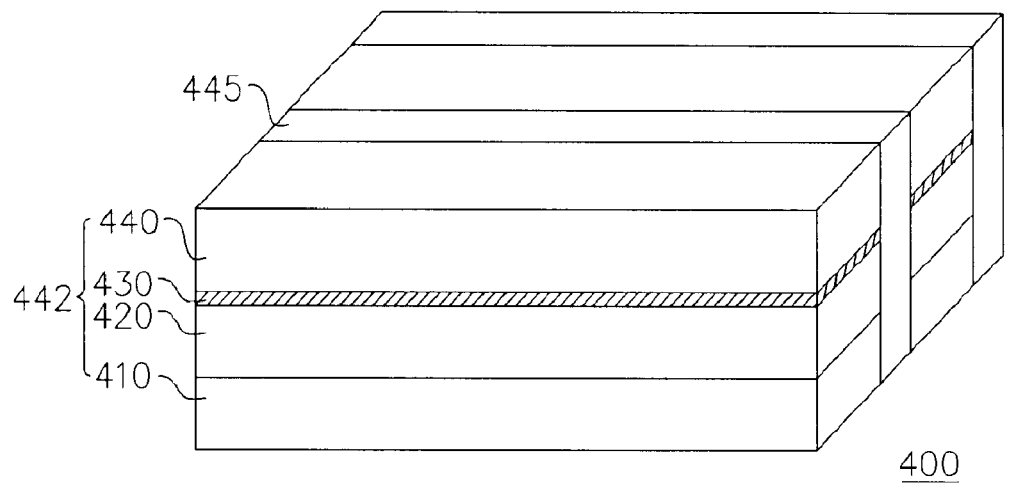
FIGS. 4A–4F illustrate a process flow of fabricating an OTP-ROM device according to a fourth embodiment of this invention, wherein FIGS. 4C/4E/4F shows an OTP-ROM structure of the fourth embodiment having 1/2/3 layers of memory cells.

Referring to FIG. 4A, a conductive layer 410, an N-doped layer 420, an antifuse layer 430 and a P-doped amorphous silicon layer 440 are sequentially formed on a substrate 400. The materials and/or forming methods of the substrate 400, the conductive layer 410, the N-doped layer 420 and the antifuse layer 430 can be the same as those mentioned in the third embodiment. The four layers 440, 430, 420 and 410 are then patterned sequentially to form parallel linear stacked structures 442. An insulating layer 445 is then filled in between the linear stacked structures 442, wherein the conductive layer 410 in each linear stacked structure 442 serves as a word line of the memory cells of the first layer.

Figure 4B:
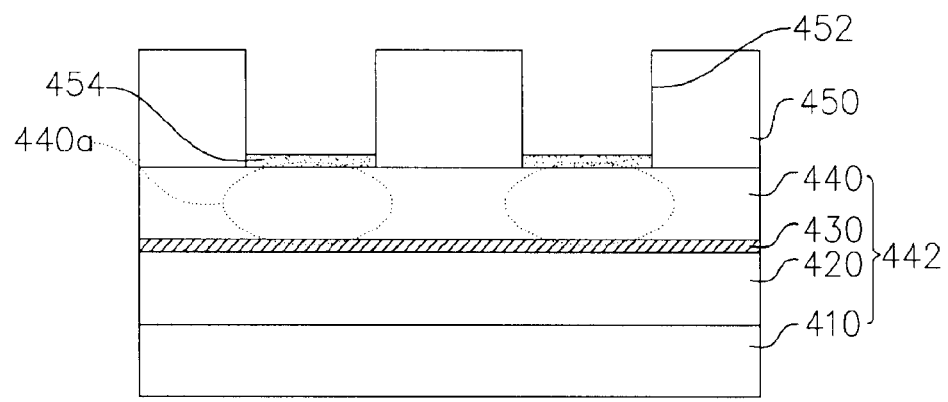

Referring to FIG. 4B, another insulating layer 450 is formed over the substrate 400, and then patterned to form parallel trenches 452 that have an orientation perpendicular to that of the linear stacked structures 442 in the insulating layer 445. A plurality of nucleation layers 454 are then formed on the portions of the P-doped amorphous silicon layer 440 that are exposed by the trenches 452. The nucleation layers 454 are Ge seed layers, for example, which may be formed with the method mentioned in the second embodiment. An annealing process is then performed to convert the portions of the P-doped amorphous silicon layer 440 under the nucleation layers 454 into P-doped single-crystal silicon blocks 440a, wherein the process temperature is preferably 500–550° C. In the resulting structure, a P-doped single-crystal silicon block 440a, the portion of the N-doped layer 420 under the same and the antifuse layer 420 between them together constitute a memory cell of the first layer.

Figure 4C:
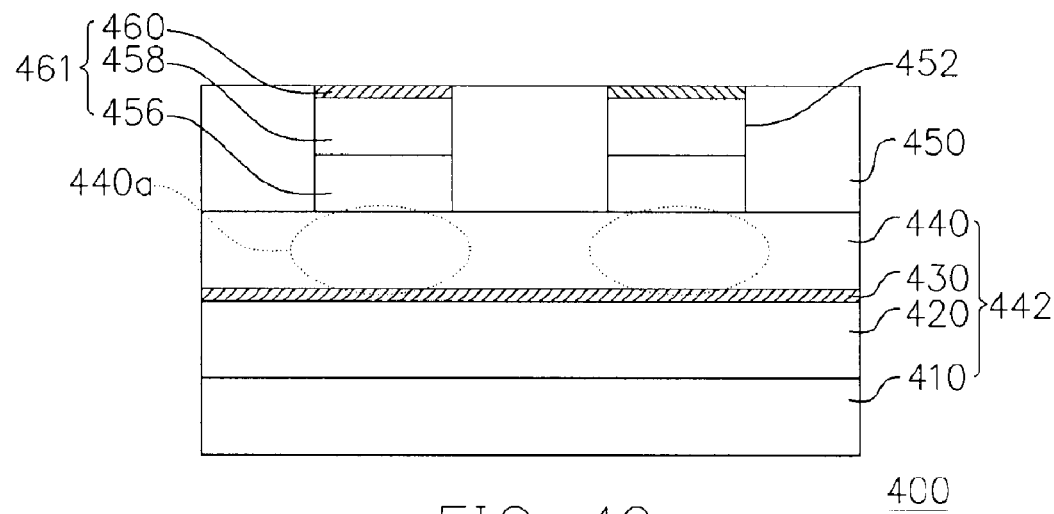

Referring to FIG. 4C, the nucleation layers 454 are removed, and a conductive layer 456, an N-doped layer 458 and an antifuse layer 460 are sequentially filled into each trench 452 to form a linear stacked structure 461 in each trench 452. The conductive layers 456 serve as bit lines of the memory cells of the first and the second layers, while the N-doped layers 458 and the antifuse layers 460 are parts of the memory cells of the second layer. Accordingly, when only one layer of memory cells is to be formed, the above process is terminated on the filling step of the conductive layers 456.

Figure 4D:
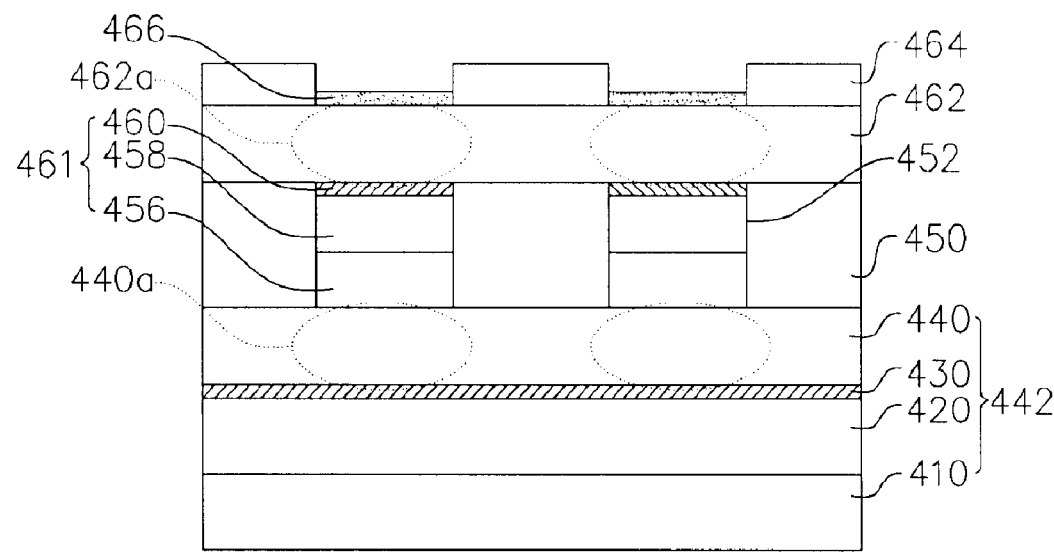

Referring to FIG. 4D, another P-doped amorphous silicon layer 462 is formed over the substrate 400, and then a patterned mask layer 464 is formed on the P-doped amorphous silicon layer 462 exposing linear portions of the P-doped amorphous silicon layer 462 overlying the N-doped layers 458. The material of the mask layer 464 is low-temperature oxide (LTO), for example, which is formed with a plasma-enhanced chemical vapor deposition (PECVD) process. Thereafter, linear nucleation layers 466, such as linear Ge seed layers, are formed on the exposed portions of the P-doped amorphous silicon layer 462. An annealing process is then performed to convert the portions of the P-doped amorphous silicon layer 462 under the linear nucleation layers 466 into P-doped single-crystal silicon layers 462a. After the P-doped single-crystal silicon layers 462a are formed, the mask layer 464 and the linear nucleation layer 466 are removed.

Figure 4E:
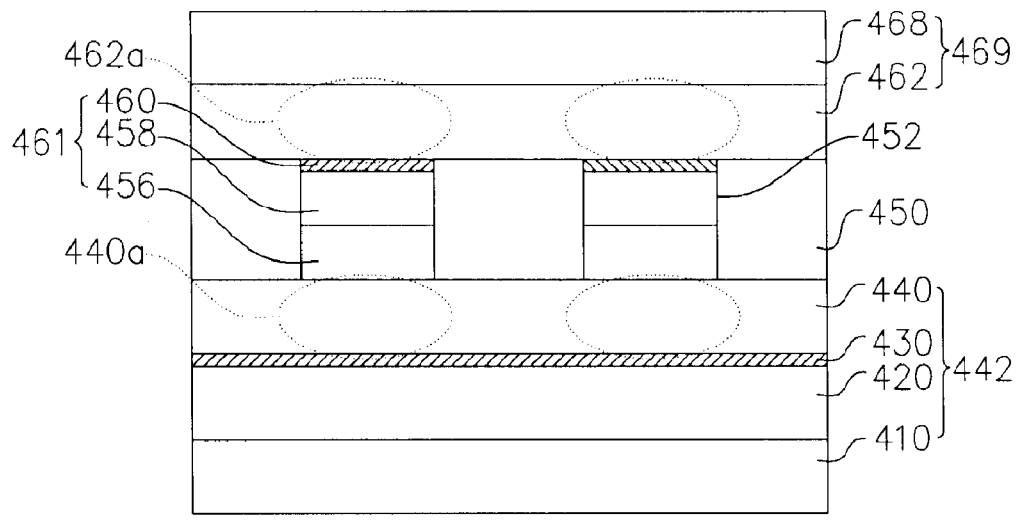

Referring to FIG. 4E, a conductive layer 468 is then formed on the P-doped amorphous silicon layer 462 and the P-doped single-crystal silicon layers 462a, and then the conductive layer 468, the P-doped amorphous silicon layer 462 and the P-doped single-crystal silicon layers 462a are patterned to form a plurality of linear stacked structures 469. The orientation of the linear stacked structures 469 is perpendicular to that of the linear stacked structures 461 in the former insulating layer 450, and is the same as that of the lowest linear stacked structures 442. In addition, the patterned conductive layer 468 serves as word lines of the memory cells of the second layer. The fabrication of the memory cells of the second layer is thus completed, wherein a P-doped single-crystal silicon layer 462a and the antifuse layer 460 and the N-doped layer 458 under the same together constitute an OTP-ROM cell of the second layer.

Figure 4F:
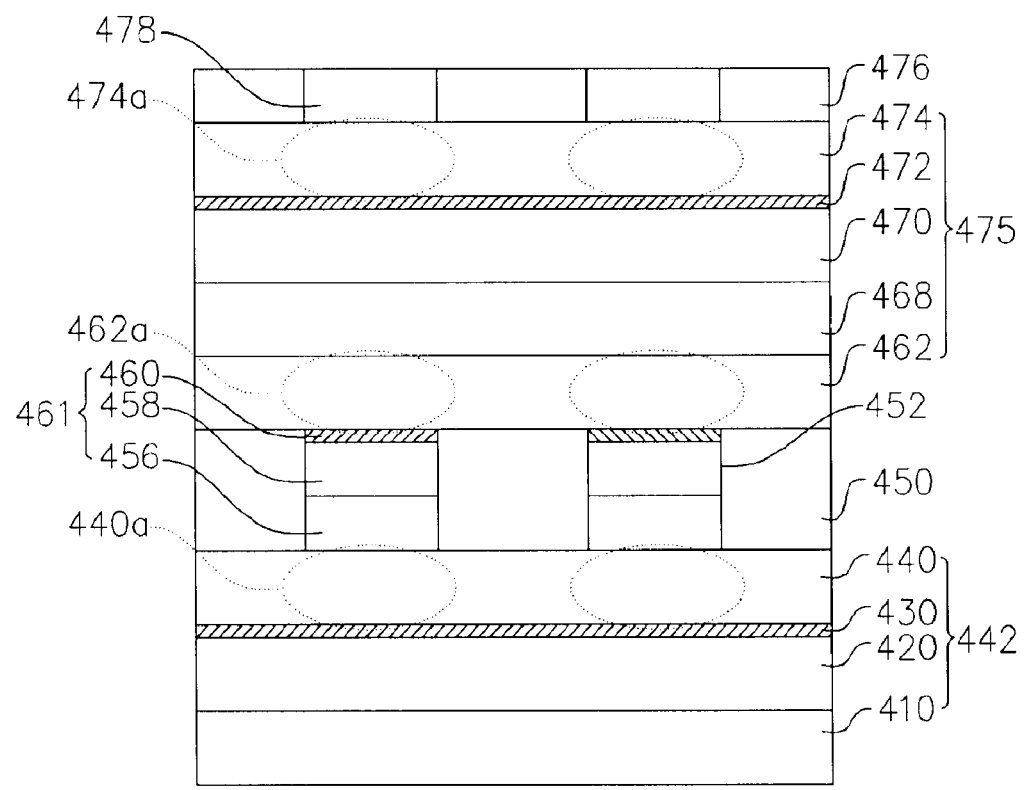

Furthermore, as in the case of the third embodiment, a 3D OTP-ROM device having multi-layers of memory cells can also be fabricated in the fourth embodiment by cyclically repeating the above steps. For example, as shown in FIGS. 4E–4F, when the third layer of memory cells is to be formed, an N-doped layer 470, an antifuse layer 472 and a P-doped amorphous silicon layer 474 are formed on the conductive layer 468 before the conductive layer 468, the P-doped amorphous silicon layer 462 and the P-doped single-crystal silicon layers 462a are patterned. Then, the P-doped amorphous silicon layer 474, the antifuse layer 472, the N-doped layer 470, the conductive layer 468, the P-doped amorphous silicon layer 462 and the P-doped single-crystal silicon layers 462a are patterned to form linear stacked structures 475 having an orientation perpendicular to that of the linear stacked structures 461 in the lower insulating layer 450. Thereafter, the step of forming single-crystal silicon layers (440a) through the step of filling conductive layers (456) into trenches (452) that are illustrated in FIGS. 4B–4C are repeated again to form single-crystal silicon layers 474a, an insulating layer 476 and conductive layers 478 in the insulating layer 476, whereby the fabrication of an OTP-ROM device having three layers of memory cells is completed.

Moreover, if the step of forming single-crystal silicon layers (440a) through the step of defining word lines (468) that are illustrated in FIGS. 4B–4E are repeated again after the linear stacked structures 475 are formed, an OTP-ROM device having four layers of memory cells can be fabricated. The above steps are repeated cyclically until a predetermined number of layers of memory cells are fabricated.

On the other hand, the structure of an OTP-ROM having only one layer of memory cells according to the fourth embodiment is shown in FIG. 4C, and is obtained by performing the first step illustrated in FIG. 4A through the filling step of the conductive layers 456 illustrated in FIG. 4C. The structure of an OTP-ROM having two layers of memory cells is obtained by performing the first step through the patterning step of the conductive layer 468, the P-doped amorphous silicon layer 462 and the P-doped single-crystal silicon layers 462a illustrated in FIG. 4E. Generally speaking, as shown in FIGS. 4E–4F, a 3D OTP-ROM structure of the fourth embodiment includes at least three layers of linear stacked structures (e.g., 442, 461 and 469). The orientation of the linear stacked structures in one layer is different from that of the linear stacked structures in an adjacent layer, as indicated by the orientations of the linear stacked structures 442 and 461 or by those of the linear stacked structures 461 and 469.

Referring to FIGS. 4E–4F again, a linear stacked structure in an odd layer, for example, a linear stacked structure 475 of the third layer, includes, from bottom to top, a lower P-doped silicon layer (462), a conductive layer (468), an N-doped semiconductor layer (470), an antifuse layer (472) and an upper P-doped silicon layer (474). Each linear stacked structure of the first layer does not include a lower P-doped silicon layer, i.e., no layer is disposed under the conductive layers 410 of the first layer. Moreover, when the highest layer is an odd layer, each linear stacked structure of the highest odd layer does not include an N-doped semiconductor layer, an antifuse layer and an upper P-doped silicon layer. As shown in FIG. 4E, when the highest layer is the third layer, no layer is disposed on the conductive layer 468 of the highest layer. In addition, a linear stacked structure in an even layer, for example, a linear stacked structure 461 of the second layer, includes, from bottom to top, a conductive layer (456), an N-doped semiconductor layer (458) and an antifuse layer (460). However, when the highest layer is an even layer, each linear stacked structure of the highest even layer does not include an N-doped semiconductor layer and an antifuse layer. As shown in FIG. 4F, when the highest layer is the fourth layer, no layer is disposed on the conductive layers 478 of the fourth layer. Meanwhile, each lower silicon layer of an odd layer, for example, the lower silicon layer 462 of the third layer, includes lower single-crystal silicon blocks (462a) and amorphous silicon blocks each between two lower single-crystal silicon blocks (462a). In a lower silicon layer (462), a lower single-crystal silicon block (462a) is located on the antifuse layer (460) of a lower linear stacked structure (461)

that overlaps with the lower silicon layer (462). In addition, each upper silicon layer of an odd layer, for example, the upper silicon layer 440 of the first layer, includes upper single-crystal silicon blocks (440a) and amorphous silicon blocks each between two upper single-crystal silicon blocks (440a). In an upper silicon layer (440), an upper single-crystal silicon block (440a) is located under the conductive layer (456) of an upper linear stacked structure (461) that overlaps with the upper silicon layer (440).

Moreover, as well known those skilled in the art, the conductivity types of the P-doped layers and the N-doped layers in the aforementioned fourth embodiment can be readily interchanged to meet some special requirements.

Since at least one of a pair of P-doped layer and N-doped layer that constitute a PN junction is composed of single-crystal silicon in the OTP-ROM structure of the fourth embodiment, the characteristics of PN junction are more uniform, and the leakage current of the PN junction under reverse bias can be reduced. Therefore, the characteristics of the OTP-ROM cells having such PN junctions are more uniform, and the leakage current of the same can also be reduced.

Moreover, the step of defining silicon nucleation sites illustrated in FIG. 4B is integrated with an inherent damascene process in the OTP-ROM process of the fourth embodiment, as in the case of the third embodiment. That is, single-crystal silicon is formed under nucleation layers that are formed on the amorphous silicon exposed by the openings in an inter-layer insulator. Therefore, this step does not require forming and patterning a sacrificial layer for defining nucleation sites.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a one-time programmable read-only memory (OTP-ROM) cell, comprising:

forming a stacked structure on a substrate, wherein the stacked structure comprises, from bottom to top, a first doped layer, a dielectric layer and a nucleation layer;

forming an insulating layer over the substrate, the insulating layer having an opening therein exposing a portion of the nucleation layer;

forming a second doped layer of polysilicon or amorphous silicon in the opening; and performing an annealing process to convert the second doped layer into a first single-crystal silicon layer, wherein one of the first doped layer and the second doped layer is P-doped, and the other is N-doped.

2. The method of claim 1, wherein the first doped layer comprises a second single-crystal silicon layer.

3. The method of claim 1, wherein the first doped layer comprises a polysilicon layer.

4. The method of claim 3, wherein a major carrier concentration of the second doped layer is lower than a major carrier concentration of the first doped layer.

5. The method of claim 1, wherein the nucleation layer comprises a silicon nitride layer.

6. A method for forming a one-time programmable read-only memory (OTP-ROM) cell, comprising:

forming a stacked structure on a substrate, wherein the stacked structure comprises, from bottom to top, a first doped layer, a dielectric layer and a second doped layer of polysilicon or amorphous silicon, wherein one of the first doped layer and the second doped layer is P-doped, and the other is N-doped;

forming an insulating layer over the substrate, the insulating layer having an opening therein exposing a portion of the second doped layer;

forming a nucleation layer on the second doped layer exposed by the opening; and performing an annealing process to convert the portion of the second doped layer under the nucleation layer into a first single-crystal silicon layer.

7. The method of claim 6, wherein the first doped layer comprises a second single-crystal silicon layer.

8. The method of claim 6, wherein the first doped layer comprises a polysilicon layer.

9. The method of claim 8, wherein a major carrier concentration of the second doped layer is lower than a major carrier concentration of the first doped layer.

10. The method of claim 6, wherein forming the nucleation layer comprises forming a germanium (Ge) seed layer.

11. A one-time programmable read-only memory (OTP-ROM) process, comprising:

(a) providing a substrate having an insulating layer and linear stacked structures formed thereon, wherein the linear stacked structures are embedded in trenches of the insulating layer, and each linear stacked layer includes, from bottom to top, a semiconductor layer of a first conductivity type, an anti-fuse layer and a nucleation layer;

(b) forming a next insulating layer over the substrate;

(c) forming a plurality of trenches in the next insulating layer in an orientation different from an orientation of the trenches in the former insulating layer, so that multi-portions of each nucleation layer are exposed;

(d) filling a polysilicon layer of a second conductivity type into each trench in the next insulating layer; and (e) performing an annealing process to convert portions of the polysilicon layers on the nucleation layers into single-crystal silicon layers, wherein a single-crystal silicon layer, the nucleation layer and the antifuse layer under the single-crystal silicon layer, and a portion of a semiconductor layer under the single-crystal silicon layer together constitute a memory cell.

12. The OTP-ROM process of claim 11, wherein each linear stacked structure further comprises a conductive layer under the semiconductor layer; and the OTP-ROM process further comprises:

(f) filling a next conductive layer in each trench of the next insulating layer.

13. The OTP-ROM process of claim 12, further comprising the following steps for forming a 3D memory:

(g) forming a next semiconductor layer, a next antifuse layer and a next nucleation layer on the conductive layer in each trench of the next insulating layer, so as to form a next stacked structure; and cyclically repeating the steps (b)–(g) to form upper insulating layers and linear stacked structures until a predetermined number of layers of memory cells are fabricated, wherein the orientation of the trenches formed in one insulating layer is different from that of the trenches formed in an adjacent insulating layer, and the step (g) is not performed in the last cycle of steps.

14. The OTP-ROM process of claim 11, wherein the nucleation layer comprises a silicon nitride layer.

15. A one-time programmable read-only memory (OTP-ROM) process, comprising:
(a) providing a substrate having an insulating layer and linear stacked structures formed thereon, wherein the linear stacked structures are embedded in trenches of the insulating layer, and each linear stacked layer includes, from bottom to top, a semiconductor layer of a first conductivity type, an antifuse layer and an amorphous silicon layer of a second conductivity type;
(b) forming a next insulating layer over the substrate;
(c) forming a plurality of trenches in the next insulating layer in an orientation different from an orientation of the trenches in the former insulating layer, so that multi-portions of each amorphous silicon layer in the former insulating layer are exposed;
(d) forming a nucleation layer in each trench of the next insulating layer;
(e) performing an annealing process to convert the portions of the amorphous silicon layers under the nucleation layers into single-crystal silicon layers;
(f) removing the nucleation layers; and
(g) forming a conductive layer in each trench of the next insulating layer, wherein
a single-crystal silicon layer, the antifuse layer under the single-crystal silicon layer and a portion of a semiconductor layer under the single-crystal silicon layer together constitute a memory cell.

16. The OTP-ROM process of claim 15, wherein forming the nucleation layers in the trenches of the next insulating layer comprises:
selectively depositing germanium on the portions of the amorphous silicon layers exposed by the trenches of the next insulating layer; and
performing an annealing process to convert the deposited germanium into single-crystal germanium.

17. The OTP-ROM process of claim 15, further comprising:
(h) forming a next semiconductor layer of the first conductivity type and a next antifuse layer on the conductive layer in each trench of the next insulating layer;
(i) forming a next amorphous silicon layer of the second conductivity type over the substrate;
(j) forming a plurality of linear nucleation layers on the next amorphous silicon layer, wherein each linear nucleation layer is located over a next semiconductor layer;
(k) performing an annealing process to convert the portions of the next amorphous silicon layer under the linear nucleation layers into single-crystal silicon layers;
(l) removing the linear nucleation layers;
(m) forming a next conductive layer on the next amorphous silicon layer including the single-crystal silicon layers; and
(n) patterning the next conductive layer and the next amorphous silicon layer including the single-crystal silicon layers to form a plurality of linear stacked structures that have an orientation different from an orientation of the trenches in the next insulating layer.

18. The OTP-ROM process of claim 17, wherein the step (j) of forming a plurality of linear nucleation layers on the next amorphous silicon layer comprises:
forming a mask layer on the next amorphous silicon layer;
patterning the mask layer to form a plurality of trenches, wherein each trench exposes a linear portion of the next amorphous silicon layer that overlies a next semiconductor layer; and
selectively forming single-crystal germanium on the linear portions of the next amorphous silicon layer to serve as the nucleation layers; and
the OTP-ROM process further comprising:
removing the mask layer before the next conductive layer is formed.

19. The OTP-ROM process of claim 17, wherein
the step (m) further comprises sequentially forming a still next semiconductor layer of the first conductivity type, a still next antifuse layer and a still next amorphous silicon layer of the second conductivity type; and
the step (n) comprises patterning the still next amorphous silicon layer, the still next antifuse layer, the still next semiconductor layer, the next conductive layer and the next amorphous silicon layer to form a plurality of linear stacked structures that have an orientation different from an orientation of the trenches in the next insulating layer; and the OTP-ROM process further comprises:
(o) filling a still next insulating layer in between the linear stacked structures formed in the step (n); and
cyclically repeating the steps (b)–(o) to form higher insulating layers and linear stacked structures until a predetermined number of layers of memory cells are fabricated, wherein the OTP-ROM process is terminated on a step (g) or a step (n), and when the OTP-ROM process is terminated on a step (n), the terminal step (n) and the step (m) just before the terminal step (n) are according to claim 21.

* * * * *